United States Patent [19]

Kaneko et al.

[11] Patent Number: 4,663,850

[45] Date of Patent: May 12, 1987

[54] MOIRE SIMULATOR AND METHOD OF USING SAME

[75] Inventors: Yujiro Kaneko; Eiji Tadano, both of Tokyo, Japan

[73] Assignee: Fuji Photo Film Co., Ltd., Japan

[21] Appl. No.: 648,631

[22] Filed: Sep. 7, 1984

[30] Foreign Application Priority Data

Sep. 8, 1983 [JP] Japan ................................ 58-165702

[51] Int. Cl.⁴ ............................................. G02B 27/00
[52] U.S. Cl. ..................................... 33/1 BB; 33/1 B; 33/1 N
[58] Field of Search ................ 33/1 B, 1 C, 1 N, 1 L, 33/1 S, 1 BB; 356/150, 71

[56] References Cited

U.S. PATENT DOCUMENTS 3,109,239  11/1963  Wicker et al. ...................... 33/1 BB
3,256,770  6/1966   Wicker .............................. 356/150
4,286,385  9/1981   Huck ................................. 33/1 N Primary Examiner—Harry N. Haroian
Attorney, Agent, or Firm—Pasquale A. Razzano

[57] ABSTRACT

A moire simulator comprises a moire detecting pattern constituted by grating patterns having equal grating constants and equal grating shapes, and an angle scale. The moire detecting pattern and the angle scale are positioned on at least one transparent plate. The moire simulator is superposed on an original and rotated thereon to read a rotation angle with respect to the original, at which the extent of generation of a moire pattern is the lowest, by using the angle scale. A setting angle of a screen during screening at which the extent of generation of a moire pattern is the lowest is then calculated before a screening process is started.

1 Claim, 7 Drawing Figures

MOIRE SIMULATOR AND METHOD OF USING SAME

BACKGROUND OF THE INVENTION

1. Field of the Invention

This invention relates to a moire simulator for finding the screening conditions under which no moire pattern is generated due to interference between an original and a screen in a screening process for printing plate making and printing. This invention also relates to a method of using the moire simulator.

2. Description of the Prior Art

In printing plate making and printing, a screening process using a contact screen or a dot generator scanner is widely employed for converting the density of an original image to the magnitude of dot area and reproducing the original image as a printed image.

As described, for example, on pages 263 and 264 of "Insatsu Kogaku Benran" (Printing Engineering Manual) compiled by The Japanese Society Of Printing Science And Technology and published by Gihodo Shuppan K.K. on July 20, 1983, the screen angle for monochromatic image printing plate making is always 45°. This is because, in the case of a monochromatic image, fringes become least perceptible when the screen angle is 45°. In the case of color image printing plate making, the screen angle generally is adjusted to 45° for a black print and 90° for a yellow print when a process camera is used. Also, it is adjusted to 75° (or 15°) for a cyan print and 15° (or 75°) for a magenta print. When color scanners, i.e. electronic color separation devices, are used, the screen angles for color prints are adjusted to values different from those mentioned above, depending on the type of color scanner. For example, when Magnascan 520 supplied by Crosfield is used, the screen angle is adjusted to 15° for a black print, 90° for a yellow print, 75° for a cyan print, and 45° for a magenta print. When Scanagraph SG-808 supplied by Dainippon Screen Mfg. Co., Ltd. is used, the screen angle is adjusted to 90° for a black print, 45° for a yellow print, 15° for a cyan print, and 75° for a magenta print.

The reason why the screen angle for a yellow print is adjusted to 90° in all cases is that, by positioning the dots of the least perceptible color in this direction, generation of the most perceptible abnormality of perpendicularly intersecting lines, for example, a moire pattern, can be decreased.

When a difference between the screen angles for two color prints is less than 15°, an optical interference fringe pattern called moire arises in halftone images. In order to eliminate this problem, the screen angles for a cyan print and a magenta print are adjusted so that the difference therebetween is within the range of 15° to 30°. In the case where a light magenta print or a light cyan print is additionally formed, the screen angle therefor is generally adjusted to 30° or 60°.

In the case where a pattern having a grating constant, for example, a weave pattern of a woven fabric, a fine stripe pattern, a streak pattern of an exterior of a building or fittings, or a printed image constituted by dots, is present entirely or partially in an original image, fringes arise in a reproduced image due to interference between the grating-like patterns of the original image and the screen used in the screening process and make the reproduced image unsuitable for practical use when the angle between the directions of the grating-like patterns is less than 15°.

Particularly in color image printing, since color prints obtained by color separation and screening are used, a moire pattern readily arises due to interference between the screen and a grating-like pattern of an original image. As described on pages 439 and 440 of "Insatsu Kogaku Benran" mentioned above, generation of a moire pattern directly related to an original image including a grating-like pattern can be prevented by the methods described below.

(1) The direction of an ordinarily used screen is changed during exposure to light so that the angle between the grating-like pattern of the original image and the screen cells is 15° or more.

(2) A thick plane-parallel glass or a polarizing prism is rotated at the front stage of a lens during exposure to light.

(3) An optical interference filter is positioned at a lens and exposure to light is conducted via the optical interference filter.

(4) A halftone printed original is copied to obtain a print, and an image of continuous tone is formed by the application of an air brush to the print. The simplest method is to carry out exposure to light by slightly deviating the focusing point of a lens.

The methods (2) and (3) mentioned above are not generally used in practice since they require a special optical device in addition to a process camera or a scanner for screening, and the cost of the apparatus becomes high or operations become complicated. The method (4) requires handicraft skills and is not suitable for use for general purposes since the original is limited to a halftone print.

Therefore, prevention of a moire pattern has heretofore been effected by using the method (1) and, when necessary, by deviating the focusing point of the lens.

In the aforesaid technique of preventing a moire pattern, when an unexpected moire pattern arises in a halftone separation image obtained by screening, the screening process is repeated by correcting the screen angle to obtain a screened image free from a moire pattern. Thus the technique involves a large loss of time and material. Further, in the color separation process and the screening process for color printing plate making, the screen angle for each separated color and the grating constant and direction of the grating-like pattern of an original image are related to each other in a complicated manner. Therefore, a moire pattern cannot be eliminated by a single correction of the screen angle but can be eliminated by repeating the screening process many times. Thus there is a marked loss of time and materials. Further, high-grade skill is required for doing the work correctly and quickly.

SUMMARY OF THE INVENTION

The primary object of the present invention is to provide a moire simulator for finding in advance the generation of a moire pattern without conducting a screening process.

Another object of the present invention is to provide a method of using the moire simulator for finding a screen angle and setting values for sharpness and focusing point in halftone photography at which no moire pattern arises.

The moire simulator of the present invention comprises at least one transparent flat plate, a moire detecting pattern constituted by grating patterns having equal grating constants and equal grating shapes such that, when said moire detecting pattern is superposed on an original, a moire pattern approximately similar to that arising during the plate making process and the screening process using said original is generated due to interference with a pattern in said original, and an angle scale, said moire detecting pattern and said angle scale being positioned on said at least one transparent plate. In one aspect of the present invention, the moire detecting pattern of the moire simulator comprises magenta, yellow, cyan and black grating patterns superposed so that the grating directions thereof are different from each other.

The grating constants of the grating patterns of the moire detecting pattern should preferably be equivalent to the screen ruling of the screen used for printing plate making. The grating shapes of the grating patterns of the moire detecting pattern may, for example, be linear, square, chain, elliptical, cut line, cross line, double dot, brick, honeycomb, triangular, diamond, or round shapes. However, the grating shapes of the grating patterns should preferably be the same as that of the screen.

The method of using the moire detecting pattern comprises the steps of: superposing the moire simulator on an original, rotating the moire simulator on the original, and reading the rotation angle of the moire simulator, with respect to the original, at which the extent of generation of a moire pattern is the minimum, by use of the angle scale of the moire simulator, thereby detecting the setting angle of a screen during screening at which the extent of generation of a moire pattern is the minimum before a screening process is started.

In the present invention, it is possible to detect a moire pattern approximately similar to that arising during the screening prior to the screening process simply by superposing the moire simulator on an original. Thus it is possible to accurately find whether a moire pattern arises and to what extent it arises in the screening process without carrying out screening. Also, since a rotation angle of the moire simulator at which generation of a moire pattern is prevented can be detected by rotating the moire simulator on an original and observing the condition of the moire pattern, it is possible to eliminate the moire pattern during the screening by adjusting the screen angle to a value at which no moire pattern arises.

DESCRIPTION OF THE PREFERRED EMBODIMENTS

The present invention will hereinbelow be described in further detail with reference to the accompanying drawings.

Figure 1:
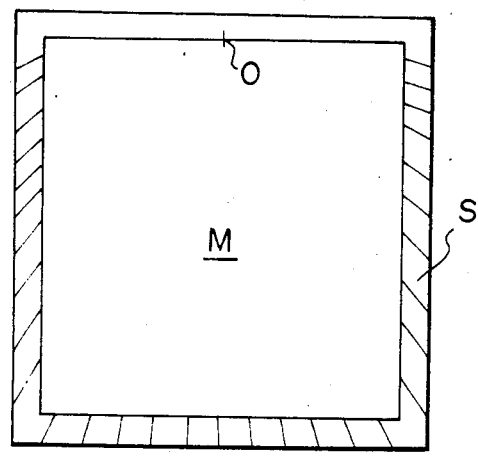
FIGS. 1, 2 and 3 are plan views showing various embodiments of the moire simulator in accordance with the present invention.
Figure 2:
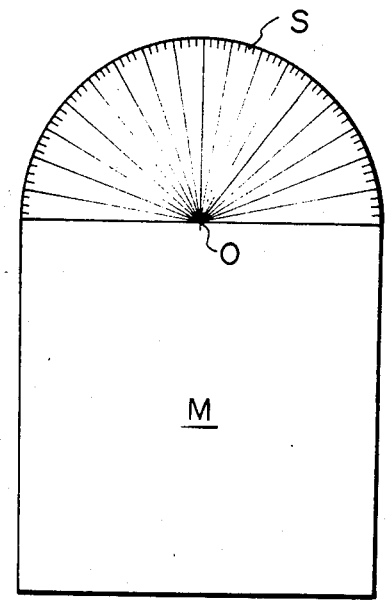
Figure 3:
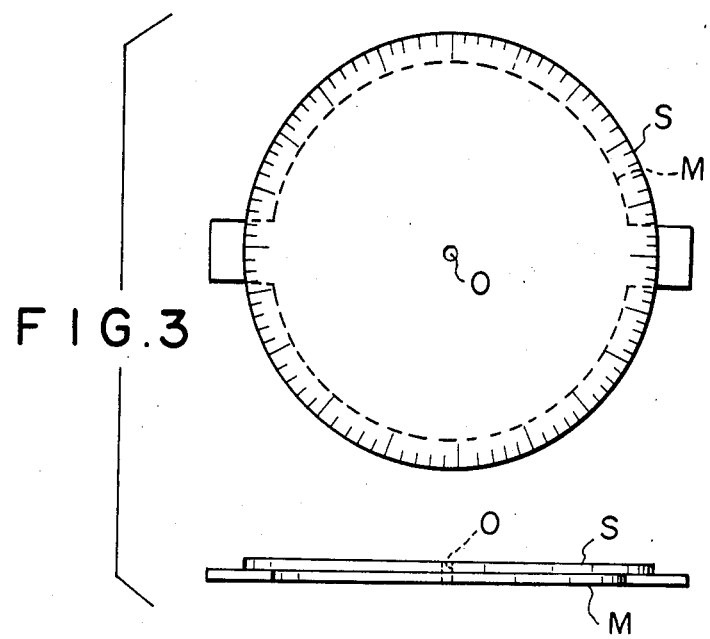
Figure 4:
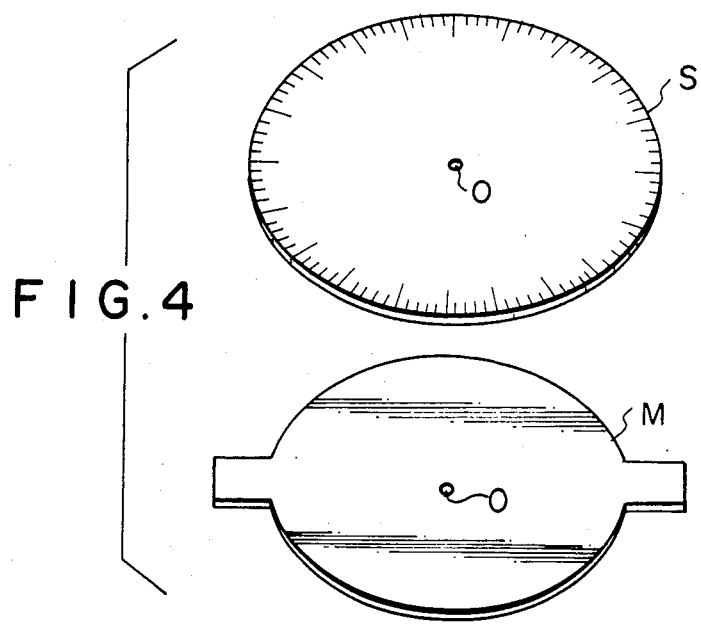
FIG. 4 is a perspective view showing the components of the moire simulator of FIG. 3.

As shown in FIGS. 1 and 2, the moire simulator of the present invention may be fabricated by positioning a moire detecting pattern M and an angle scale S on the same plane on a transparent substrate. Or, as shown in FIGS. 3 and 4, the moire simulator may be fabricated by positioning the moire detecting pattern M and the angle scale S on different transparent disc-like substrates and superposing them. FIG. 3 shows the moire detecting pattern M and the angle scale S superposed one upon the other, and FIG. 4 shows the moire detecting pattern M and the angle scale S separated from each other.

The angle scale S may be in any form insofar as the rotation angle of the moire detecting pattern M with respect to the position where it is superposed on an original in the same direction as a screen can be read out when it is rotated on the original around a point 0.

In the case of color printing, the degree of adverse effect of a moire pattern arising due to interference between an original and a screen on the printed image is related to the grating constants and the grating directions of the original image and the screen, and to the colors of the original image and the screen. For example, a moire pattern generated by a combination of a yellow original image with a yellow screen or with an original image or screen of a different color is little perceptible. However, moire patterns generated by black, cyan, and magenta images are markedly perceptible and make printed images unsuitable for practical use.

Accordingly, moire patterns which are markedly perceptible must be eliminated, and the presence of those which are not so perceptible is permissible to some extent in a printed image.

In order to simply and accurately achieve selection of an optimal screen angle in the screening process on the basis of the relationship of each color image and each color screen, the moire detecting pattern M should preferably be of the neutral grey type fabricated as described below. That is, the neutral grey type moire detecting pattern is fabricated by superposing plain color screens, which are constituted by dots having the same screen angles and, preferably, forming the same dot patterns to match the screen used in the screening process, on a single sheet. When the neutral grey type moire detecting pattern is used, it is possible to readily find the generation of a moire pattern due to interference between each separated color screen and an original image and to find a correction value of the screen angle for eliminating the moire pattern by closely contacting the moire detecting pattern with the original and rotating it when generation of the moire pattern is found. In this case, a moire pattern which is non-perceptible visually can be ignored since it is not perceptible also in a printed image. However, for example, when grating-like patterns are present in various directions in an original image, it is often impossible to find a screen angle at which no moire pattern arises. In this case, a focusing point correction value for decreasing the degree of the moire pattern by deviating the focusing point with respect to the original image is determined as described below.

Namely, a screen angle at which the degree of moire pattern is lowest is found by using the moire simulator of the present invention. A spacer such as a transparent film the thickness of which is known is inserted between the moire detecting pattern at the found screen angle and the original, and the condition of the moire pattern is observed. Thus a focusing point correction value is obtained within such a range that image sharpness is not lost.

As described above, when the moire simulator of the present invention is used, it is possible to obtain a correction value of the screen angle in the screening process and, when necessary, a correction value of the focusing point without any skill. Also, on the basis of the concept of the present invention, it is possible to realize a device provided with a scale for indicating the rotation angles of the moire detecting pattern and the correction values of the focusing point, or a device for optically detecting the generation of a moire pattern and for automatically displaying or printing out the condition under which no moire pattern arises.

Embodiments of the method of making the moire detecting pattern and the method of using the moire simulator will now be described below.

Figure 5:
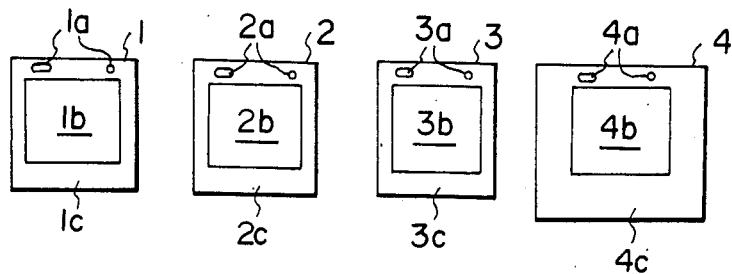
FIG. 5 is a plan view showing four plain screens used for making the moire detecting pattern of the moire simulator in accordance with the present invention.

(1) Method of making the moire detecting pattern (i) As shown in FIG. 5, four 55% plain screens (positive) comprising the chain dots at an angle of 75° for a cyan print plain screen 1, 45° for a magenta print plain screen 2, 90° for a yellow print plain screen 3, and 15° for a black print plain screen 4 are made with a predetermined number of screen lines (80, 100, 120, 150, 180, 200, or the like) by using a Magnascan 520.

(ii) The plain screens 1, 2, 3, and 4 thus obtained are superposed by aligning their positions with the film surfaces facing down without changing the angles, and positioning holes 1a, 2a, 3a, and 4a are perforated as shown in FIG. 5.

In the example of FIG. 5, colorless transparent marginal portions 1c, 2c, 3c and 4c are formed around the plain screen portions 1b, 2b, 3b and 4b.

(iii) An unexposed color duplicating film 5 is positioned with the film surface facing up, and positioning holes 5a are perforated therethrough in the same manner as the positioning holes 1a to 4a.

Figure 6:
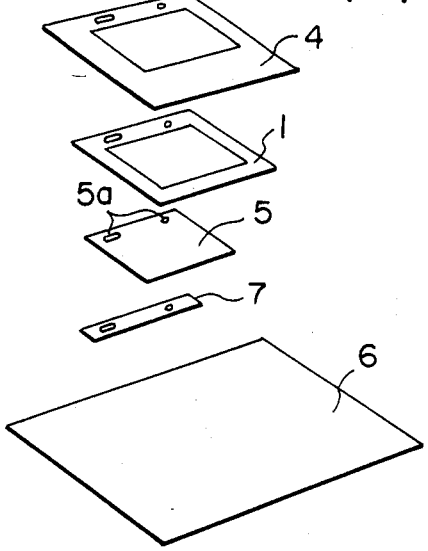
FIG. 6 is a perspective view showing the step of exposing a color duplicating film to light for making the moire simulator in accordance with the present invention.

(iv) As shown in FIG. 6, the color duplicating film 5 having the film surface facing up, the plain screen 1 for a cyan print having the film surface facing down, and the plain screen 4 for a black print having the film surface facing down are accurately aligned and superposed by use of a pin bar 7 on a vacuum board 6 in a darkroom. The stack thus formed is exposed to light emitted by a point light source 8 positioned above the black print plain screen 4 via an R filter 9 (Wratten #25).

(v) The plain screen 1 for a cyan print 1 in the step (iv) is replaced by the plain screen 2 for a magenta print, and the R filter is replaced by a G filter (Wratten #58). The stack is then exposed to light in the same manner.

(vi) The plain screen 2 for a magenta print in the step (v) is replaced by the plain screen 3, and the G filter is replaced by a B filter (Wratten #47B). The stack is then exposed to light in the same manner.

(vii) The color duplicating film 5 exposed three times to light as described above is processed for color development. The exposure amounts in the three exposure steps should preferably be adjusted so that the color duplicating film 5 is developed to neutral grey.

Figure 7:
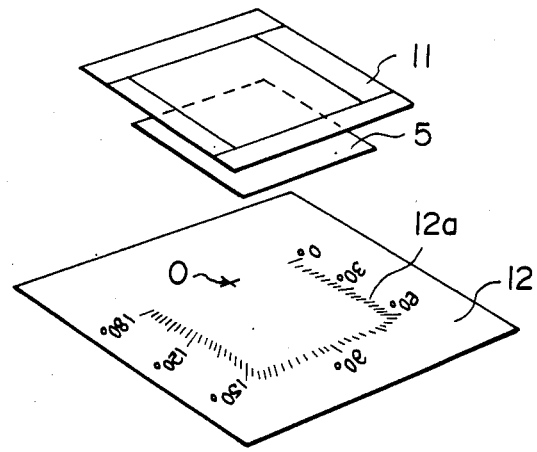
FIG. 7 is a perspective view showing the step of making the moire simulator in accordance with the present invention by use of the color duplicating film as shown in FIG. 6.

(viii) As shown in FIG. 7, the color duplicating film 5 obtained in the step (vii) and having a moire detecting pattern constituted by uniform color dot strings wherein the screen angles for black, yellow, cyan, and magenta prints are 15°, 90°, 75°, and 45° respectively is positioned with the film surface facing down and is closely contacted with a film surface of a film 12, on which an angle gauge 12a is printed in advance, by use of a PT tape 11. In this manner, a master plate of the moire simulator in accordance with the present invention is obtained. The master plate is used for reproducing the moire simulator. It is also possible to form the moire detecting pattern by making a printing plate by use of the aforesaid color prints in accordance with a known procedure and by printing on a plastic film or a glass plate.

(2) Method of using the moire simulator (a) The upper side of the moire detecting pattern of the moire simulator in accordance with the present invention, i.e. the side corresponding to 0° to 180°, is positioned parallel to the horizontal line of an original, and the moire simulator is closely contacted with the original.

(b) When no moire pattern is found in the condition of (a), the screen angle for each separated color need not be corrected.

(c) When a moire pattern is found in the condition of (a), the moire simulator is rotated clockwise or counterclockwise around the fixed center 0 of the angle scale to find the position at which the moire pattern disappears. The rotation angle at that position is read from the angle scale, and the angle value thus read out is added to or subtracted from each screen angle. Screening is conducted at the screen angle thus calculated to obtain a color printed image free from moire pattern.

(d) When the angle at which the moire pattern disappears cannot be found by the step (c), the moire simulator is fixed at an angle where the degree of the moire pattern is lowest. Transparent spacers for reading out a focusing point correction value are inserted one by one between the moire detecting pattern and the original in the sequence starting from the thinnest spacer, and the minimum focusing point correction value at which the moire pattern disappears is found. Screening is conducted by using the screen angle correction value and the focusing point correction value thus obtained, thereby forming a color printed image free from moire pattern.

We claim:

1. A method of using a moire simulator comprising at least one transparent flat plate, a moire detecting pattern constituted by grating patterns having equal grating constants and equal grating shapes, and an angle scale, said moire detecting pattern and said angle scale being positioned on said at least one transparent flat plate, the method of using the moire simulator comprising the steps of:

superposing said moire simulator on an original, rotating said moire simulator on said original, and reading a rotation angle of said moire simulator with respect to said original, at which the extent of generation of a moire pattern is the minimum, by use of said angle scale, thereby detecting the setting angle of a screen suitable for preventing the generation of a moire pattern during screening, and further comprising the step of inserting a transparent spacer for reading out a focusing point correction value between said moire simulator and said original, and finding the minimum focusing point correction value at which a moire pattern disappears.

* * * * *